(12) United States Patent
Kinney et al.

(10) Patent No.: US 7,928,354 B2
(45) Date of Patent: Apr. 19, 2011

(54) METHODS AND SYSTEMS FOR IN SITU CALIBRATION OF IMAGING IN BIOLOGICAL ANALYSIS

(75) Inventors: Patrick D. Kinney, Hayward, CA (US); Ryan J. Talbot, Mountain View, CA (US)

(73) Assignee: Life Technologies Corporation, Carlsbad, CA (US)

(*) Notice: Subject to any disclaimer, the term of this patent is extended or adjusted under 35 U.S.C. 154(b) by 31 days.

(21) Appl. No.: 12/475,904

(22) Filed: Jun. 1, 2009

(65) Prior Publication Data

US 2009/0230294 A1 Sep. 17, 2009

Related U.S. Application Data

(63) Continuation of application No. 11/383,630, filed on May 16, 2006, now Pat. No. 7,541,567, which is a continuation of application No. 10/911,887, filed on Aug. 5, 2004, now Pat. No. 7,045,756.

(51) Int. Cl.
  *H01L 27/00* (2006.01)
  *G01D 18/00* (2006.01)
  *G01N 21/86* (2006.01)
(52) U.S. Cl. .......... 250/208.1; 250/252.1; 250/559.4
(58) Field of Classification Search .......... 250/363.09, 250/559.1, 341.5, 252.1, 208.1, 559.04, 559.05, 250/559.07, 559.08, 559.4, 559.45; 348/180, 348/181, 187, 189, 191, 193; 257/48; 356/326
See application file for complete search history.

(56) References Cited

U.S. PATENT DOCUMENTS

| | | |
|---|---|---|
| 4,585,934 A | 4/1986 | French et al. |
| 5,047,861 A | 9/1991 | Houchin et al. |
| 5,475,769 A | 12/1995 | Wober et al. |
| 5,479,207 A | 12/1995 | Degi et al. |
| 6,221,592 B1 | 4/2001 | Schwartz et al. |
| 6,460,003 B1 | 10/2002 | Kump et al. |
| 6,642,499 B1 | 11/2003 | Boni et al. |
| 6,934,421 B2 | 8/2005 | Gindele et al. |
| 7,054,474 B1 | 5/2006 | Krieger |
| 7,280,141 B1 | 10/2007 | Frank et al. |
| 7,570,287 B2* | 8/2009 | Tsuruoka ............ 348/241 |
| 2004/0066978 A1 | 4/2004 | Nanbu |
| 2005/0157189 A1* | 7/2005 | Sambongi ............ 348/241 |

OTHER PUBLICATIONS

Tristan Buey and Didier Tiphene, *CorotCAM Calibration CCD Calibration Philosophy*, 1-10, Corot Workshop (Sep. 18, 2000).
*Guide to Streak Cameras*, 3-15, Hamamatsu Photonics K.K., Systems Division, Cat. No. SSCS1035E03 (1999).
Nathan Eric Howard, *Opsci Application Note OAN-006, Photon Transfer Technique*, 1-16, Opsci, Inc. (Feb. 19, 2002).
James R. Janesick, *Scientific Charge-Coupled Devices*, 1-13, Spie Press (2001).

* cited by examiner

*Primary Examiner* — Georgia Y Epps
*Assistant Examiner* — Pascal M Bui-Pho

(57) ABSTRACT

Software, methods, and systems for calibrating photometric devices are provided. These involve using a non-uniform test illumination field to approximate a photon transfer curve by calculating stable pixel values and statistical dispersions on a pixel-by-pixel basis.

12 Claims, 5 Drawing Sheets

METHODS AND SYSTEMS FOR IN SITU CALIBRATION OF IMAGING IN BIOLOGICAL ANALYSIS

CROSS-REFERENCE TO RELATED APPLICATIONS

This application is a continuation of patent application Ser. No. 11/383,630 filed May 16, 2006, which is a continuation of patent application Ser. No. 10/911,887 filed Aug. 5, 2004, now U.S. Pat. No. 7,045,756, both of which are incorporated herein by reference.

INTRODUCTION

The present teachings generally relate to methods, software, and apparatus useful in evaluation of photometric sensors, for example in in-situ evaluation of imaging instrumentation in biological instruments.

During imaging operations such as biological analysis involving nucleotide sequencing or microarray processing, photometric sensors are used to detect signals arising from labeled samples or probe features responsive to selected target analytes. These signals can take the form of electromagnetic emissions that are desirably analyzed to quantify signal intensities arising from labeled samples or probe features and are subsequently resolved to quantitatively or qualitatively evaluate the presence of a target analyte within a sample. Frequently, images associated with such biological analyses vary in intensity and are of a very high-resolution to accommodate reading of very detailed images such as high-density microarrays. Therefore, highly precise imaging is required, and such imaging is frequently performed in connection with a charge coupled device (CCD).

The quality of data produced by a CCD-based instrument is tightly coupled to a particular CCD's performance. Algorithms for data analysis, for example, commonly assume the CCD detector provides a linear response. Published limits of detection for a particular instrument rely on assumed CCD noise levels. Characteristics such as CCD noise levels are tested and confirmed during instrument development, and verified during instrument manufacturing. Regardless of initial testing and verification, however, an instrument's performance in-the-field is susceptible to drift and/or changes in noise levels of a CCD contained within the instrument.

Quantitative CCD performance measurement can be performed by measuring a particular CCD's photon transfer curve. A photon transfer curve involves a plot of detected signal level versus observed noise in the signal level. Conventionally, the relationship between signal and noise for generating a photon transfer curve has been measured as follows. First, a CCD removed from and external to its corresponding instrument and/or optical assembly is attached to a special test fixture designed to uniformly illuminate the CCD array. A series of detections or images are measured to determine the average signal noise for a fixed illumination level. For example, multiple images are recorded at a given illumination level. Each unique combination of two images are subtracted from one another to produce a series of difference-images. The signal noise is determined by computing the average of the difference-image pixel intensity values. The illumination level is determined either by separate measurement of the illumination source using a calibrated light detector, or by averaging the signal from the CCD detector itself. Each set of images produces a single point on the photon transfer curve, and the measurement is repeated over a series of illumination levels and/or exposure times. The photon transfer curve for the CCD is constructed by plotting the observed signal level versus the noise in the signal level. In the shot-noise-limited region of the detector, the noise will scale with the square root of the signal level, appearing linear when plotted on a log scale. The photon transfer curve enables the measurement of a series of CCD performance characteristics including read noise, full well capacity, and gain.

The traditional method of measuring photon transfer curve requires that the CCD detector to be exposed to a fairly uniform illumination field. As the uniformity of the illumination field decreases, known procedures become unworkable. In moderately non-uniform illumination fields (of approximately +/−10%), known processes produce a noisy photon transfer curve. In a highly non-uniform illumination field of >+/−20%, it becomes essentially impossible to approximate a photon transfer curve using known processes. Moreover, in situ, within a particular instrument, it is not typically possible to produce a uniform illumination field sufficient to enable measurement of the photon transfer curve using known procedures.

Facing governmental regulations regarding instrument validation, new instrumentation technologies and methods are required to verify biological instrument performance. Moreover, components of instruments must be validated as a part of the instrument as a whole. However, field-verification of a CCD or other photometric detector is complicated by the fact that the photometric detector is contained within a larger instrument system.

Accordingly, methods, software and apparatus to directly and quantitatively verify photometric detectors in situ are needed to provide characterization information regarding the particular photometric detector, allowing instrument failure detection, improved troubleshooting, quantitative instrument subsystem characterization, and generally improved self-diagnostic capability.

SUMMARY

According to various embodiments, the present teachings involve methods, software, and apparatus for determining operating characteristics for photometric detectors. In various embodiments, the present teachings relate to means for directly verifying the performance of a photometric detector installed as a subsystem within a larger instrument system.

According to other various embodiments, a method is provided for determining operating characteristics of a photometric detector that has photosensitive pixels. First, an active surface of the photometric detector is illuminated with electromagnetic radiation. Next, a plurality of varying brightness readings for the various pixels in the plurality of photosensitive pixels is recorded. Then signal statistical dispersion values are calculated for the plurality of photosensitive pixels independently on a pixel-by-pixel basis over the plurality of varying brightness readings. Next stable intensity values for the plurality of photosensitive pixels are calculated independently on a pixel-by-pixel basis over the plurality of varying brightness readings. Further, a photon transfer curve is approximated based on the signal statistical dispersion values and the stable intensity values.

According to other various embodiments, a method for determining operating characteristics of a photometric detector, in situ, within an imaging instrument is provided. Such methods optionally further include the step of providing a proper operation indication regarding the photometric detector based on the photon transfer curve to indicate whether the photometric detector is operating properly.

According to yet other various embodiments, apparatus is provided for determining operating characteristics of a photometric sensing device contained within an instrument. The apparatus comprises a photometric sensor comprising a plurality of photosites capable of sensing intensity of electromagnetic energy at the plurality of photosites. The apparatus also comprises a test illumination field generator for generating a test illumination field optically coupled to the photometric sensor, the test illumination field comprising regions presenting a range of intensities to the photometric sensor. The apparatus also comprises a photometric sensor interface circuit coupled to the photometric sensor, the photometric sensor interface circuit operable to read out sets of photosite intensity values from the plurality of photosites, the sets of photosite intensity values corresponding to the intensity of electromagnetic energy sensed at the plurality of photosites. And the apparatus also comprises a memory coupled to the photometric sensor interface circuit, the memory comprising machine readable instructions comprising read instructions for reading a plurality of varying brightness readings of the sets of photosite intensity values while exposed to the test illumination field; noise determination instructions for calculating statistical dispersions of the sets of photosite intensity values corresponding to the plurality of varying brightness readings; stable intensity determination instructions for calculating stable intensity values corresponding to the sets of photosite intensity values at the plurality of photosites for the plurality of varying brightness readings, and photon transfer curve approximation instructions for approximating a photon transfer curve corresponding to the photometric sensor based on the statistical dispersions and the stable intensity values.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF VARIOUS EMBODIMENTS

Figure 1:
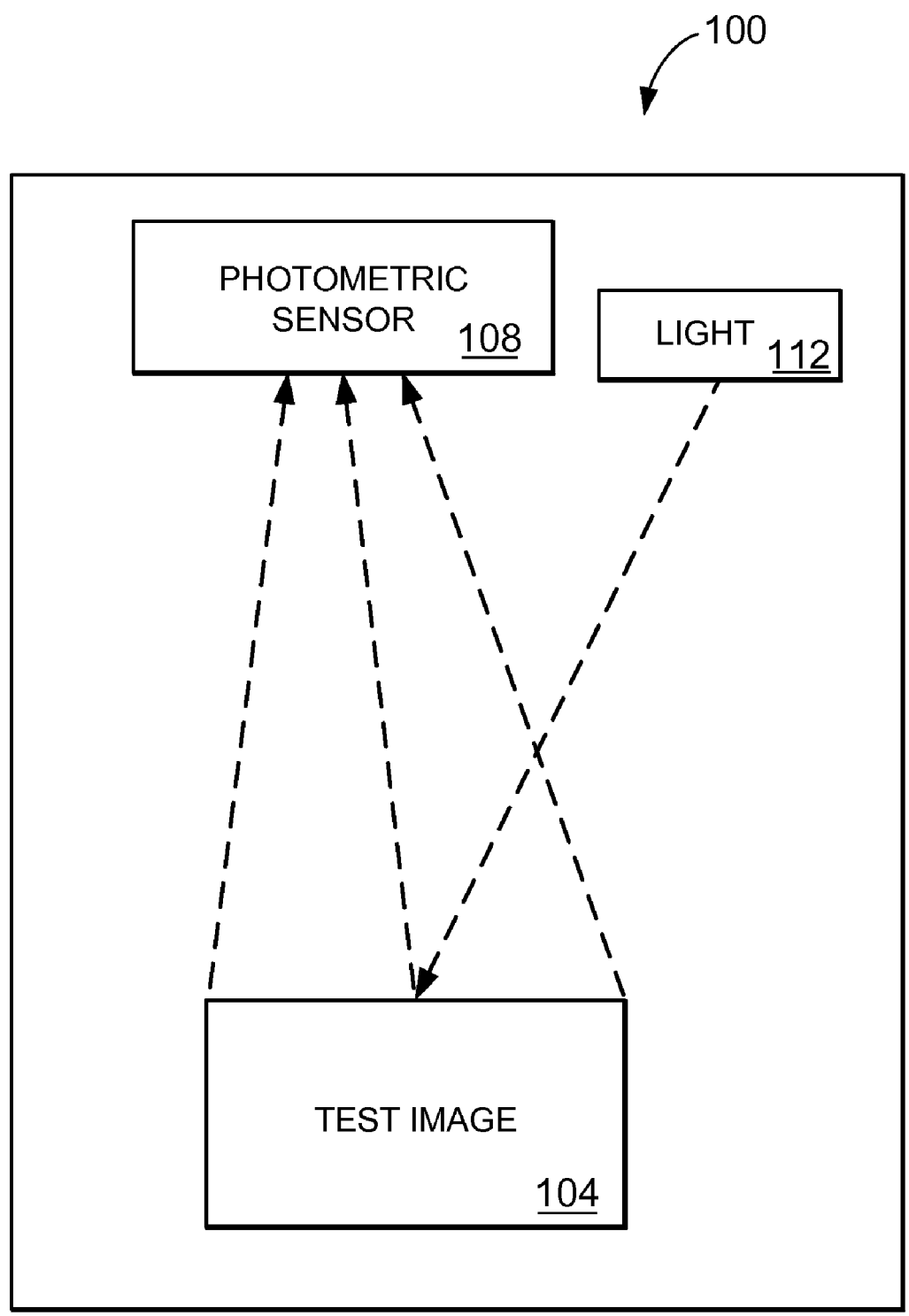
FIG. 1 illustrates portions of an exemplary photometric detection system including a photometric sensor for detecting photons scattered or emitted from a test image based on electromagnetic radiation in the form of light.

Reference will now be made in detail to some embodiments, examples of which are illustrated in the accompanying drawings. Wherever possible, the same reference numbers are used throughout the drawings to refer to the same or like parts.

Specific aspects of the present teachings are described below in the context of exemplary biological instrument embodiments. However, it is understood that the present teachings are not limited in scope to use in biological instruments but can be used in connection with any type of photometric detection instrumentation employing a photometric detector. To clarify several terms used to disclose the present teachings, several definitions are set forth below.

The terms "photometric detector" or "photometric sensor" as used herein refer to any device for measuring luminous intensity, intensity of electromagnetic radiation, or number or intensity of incident photons. Examples include, but are not limited to, charge coupled device (CCD) arrays, complementary metal oxide semiconductor photodetectors, line scan cameras, and photometric devices used for example in measuring luminous intensity for spectroscopy.

The term "sample photometric intensity readings" as used herein refers to a group of photometric readings of a pixel or group of pixels on a pixel-by-pixel basis to obtain a set of pixel intensity readings for particular pixels. Gathering a number of readings for a particular pixel, given the same illumination of that pixel, provides information regarding noise at that particular pixel.

The term "statistical dispersion" as used herein refers to a measure of numerical diversity within a particular set of numbers. Statistical dispersion is zero for a set of identical numbers and increases as diversity among the set of numbers increases. Measurements of statistical dispersion include various examples. One measure of statistical dispersion is range, which is the difference between the highest and lowest number values in the set of numbers. Another measurement of statistical dispersion is "standard deviation," which is the square root of variance. Various algorithms are known for computing the standard deviation and variance of a set of numbers.

The term "signal statistical dispersion values" as used herein refers to a measure of numerical diversity of signal intensity values at a particular pixel.

The terms "stable intensity value" and "stable pixel intensity value" as used herein refer to a value of intensity at a particular pixel absent noise. In various embodiments, a stable pixel intensity value can be obtained by calculating the average value of the pixel throughout a range of sample photometric intensity readings.

The term "spatially non-uniform in intensity" as used herein in the context of an illumination field refers to an illumination field that varies in intensity at different points in space, which is to say that the illumination field has some relatively brighter regions and some darker regions.

The term "spatial intensity" as used herein refers to the intensity of an illumination field at a particular point in space.

The term "temporally non-uniform in intensity" as used herein refers to an illumination field that changes over time for a particular period of time.

The term "temporally constant" as used herein refers to an illumination field that does not change over time for a particular period of time.

FIG. 1 illustrates portions of an exemplary photometric detection system 100 including a photometric sensor 108 for detecting photons scattered or emitted from a test image 104 based on electromagnetic radiation in the form of light emitted by the light source 112. In various embodiments, a photon transfer curve corresponding to the photometric sensor 108 is estimated using an arbitrarily non-uniform illumination field, which can generally be produced within most instruments. In various embodiments, a photometric detector is exposed to an arbitrarily non-uniform illumination field that can be provided using, for example a test sample that is specially made for validating the instrument. For example, in a microarray reader, a test slide can be provided that has a range of brightness regions in ambient light that can be imaged by the instrument to produce pixel intensity values that can be used to estimate a photon transfer curve for the microarray reader instrument's CCD. Other examples of biological analysis that involve imaging include, but are not limited to sequence detection, high-throughput screening, and other biological analysis based on imaging of fluorescent markers attached to nucleic acids that are in close proximity and/or of low light intensity. In various embodiments, an actual sample that is used in an instrument in normal operation generally has sufficiently non-uniform illumination levels to perform the photon transfer curve validation operations, thereby eliminating the need for even a test sample.

In various embodiments, the range of illumination levels received at the photometric detector is preferably highly non-uniform so that the photometric detector observes a range of illumination from total darkness to several times the full-well capacity of the photometric detector. In various embodiments, where a particular sample lacks sufficient variations in signal intensity, a series of measurements are combined to obtain illumination levels spanning the entire dynamic range of the photometric detector.

In various embodiments, each pixel of a photometric detector is used to produce a unique point on an estimated photon transfer curve. A series of images are measured with a non-uniform illumination field. In various embodiments, twenty images are measured, and twenty readings are observed for each individual pixel of a CCD detector. Each pixel has a noise value determined by computing the standard deviation of the pixel's twenty readings, and an illumination value determined by averaging the twenty readings at each pixel. For a CCD detector with dimensions of 240×320 pixels, 76,800 points are generated on the photon transfer curve according to the present teachings. If an adequate range of illumination exists, the entire photon transfer curve is produced with very high resolution after only twenty images. During the same length of time, other methods produce a single point on the photon transfer curve.

Figure 2:
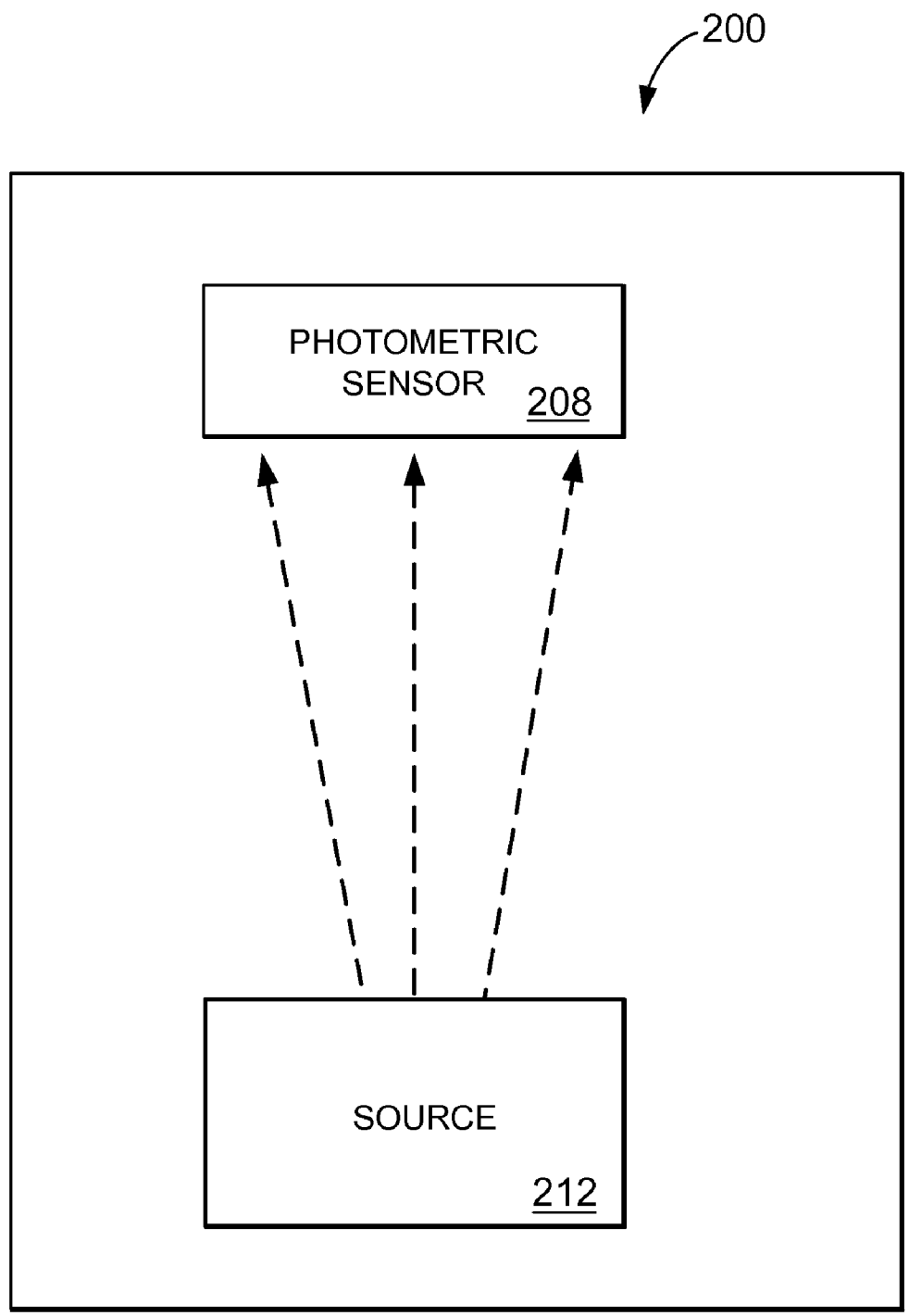
FIG. 2 illustrates portions of an exemplary imaging system including a photometric sensor detecting electromagnetic radiation emitted from a source of electromagnetic energy.

FIG. 2 illustrates portions of an exemplary imaging system 200 including a photometric sensor 208 detecting electromagnetic radiation emitted from a source of electromagnetic energy 212. In various embodiments, the photometric sensor 208 receives incident photons in the form of electromagnetic energy that is scattered off the source 212 or that the source 212 emits via fluorescence, chemiluminescence, or other means. In various embodiments, the photometric sensor 208 is a CCD contained within a biological instrument such as a microarray reader. In various embodiments, biological instruments can include a genetic analyzer with a CCD for detection of capillary electrophoresis separation, or a thermal cycler for detection of real-time PCR amplification or end-point PCR results. The CCD can be tested during manufacturing to ensure that noise values associated with the operation of the CCD fall within acceptable ranges. Moreover, the instrument itself is tested when it is manufactured to ensure that the integrated imaging system can perform imaging operations to an acceptable level of resolution.

Nevertheless, in the field, the instrument may experience adverse environmental conditions or portions of the instrument may become damaged over time or with use. In various embodiments, such instruments employ aspects of the present teachings to perform self-diagnostic operations to validate continued proper operation of the imaging system 200 within the overall instrument.

Figure 3:
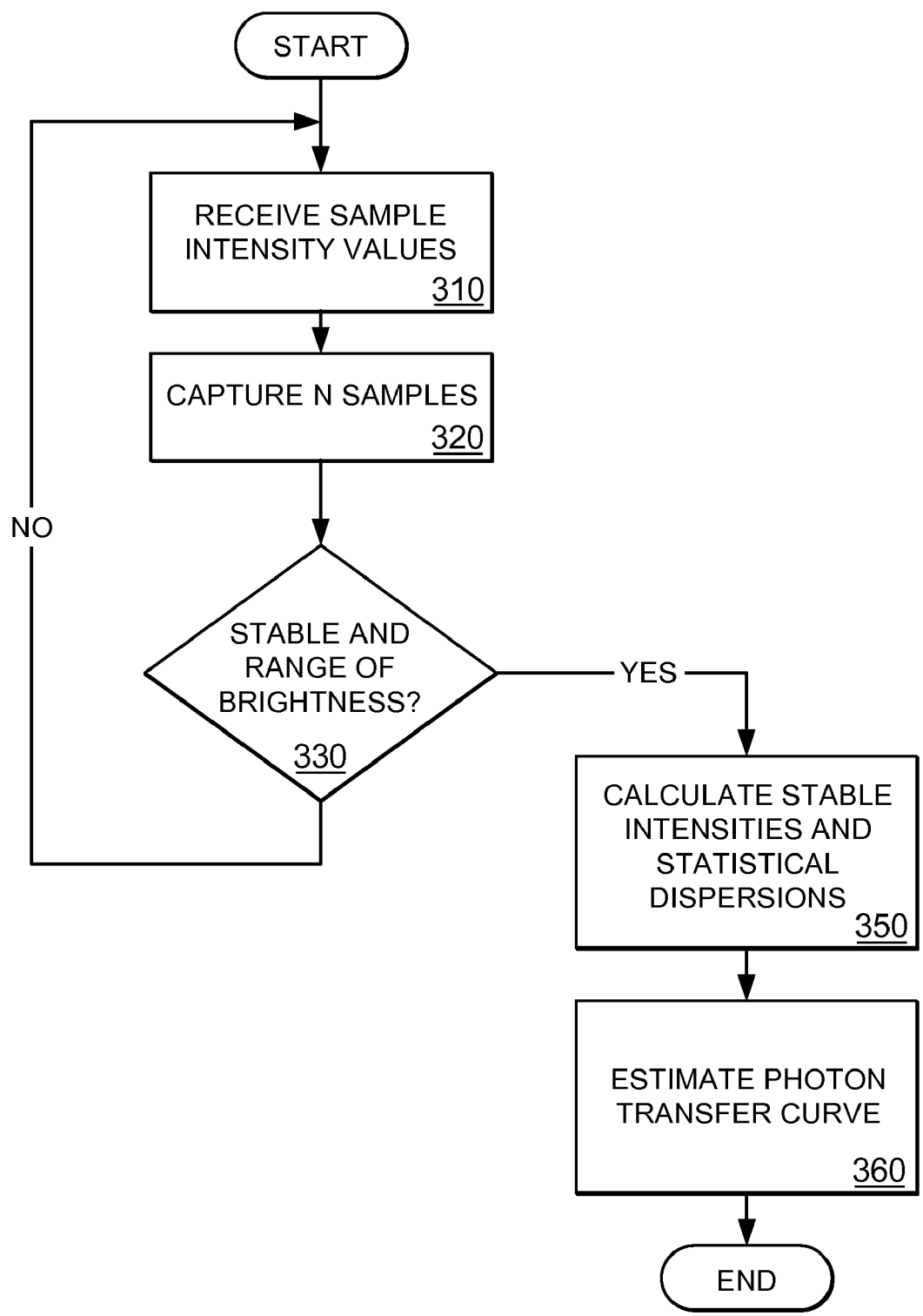
FIG. 3 illustrates a flow diagram for producing an exemplary photon transfer curve for use in in-situ evaluation of a photometric detector.

FIG. 3 illustrates a flow diagram for producing an exemplary photon transfer curve for use in in situ validation of a photometric detector. First a set of sample intensity values are received (step 310). It is understood that the step of receiving sample intensity values can be performed within the hardware, software and/or firmware of an instrument, such as a biological instrument. Moreover, it is understood that the step of receiving sample intensity values can involve remote processing on a general purpose computer system that is external to and coupled to the instrument containing the imaging system. Next, N samples are captured (step 320). It is understood that N can be any number. In various embodiments N is chosen to be twenty, and twenty sample images are captured to result in twenty sample photometric intensity readings for each pixel in the photometric detector. With twenty readings for each pixel, stable values and statistical dispersions can be calculated as set forth below.

Next, it is determined whether the illumination field is sufficiently stable to perform the operations and whether there is a sufficient range of brightness and darkness in the illumination field (step 330). In various embodiments, typical samples that are analyzed in a particular instrument contain sufficient brightness ranges to measure the photon transfer curve for a particular photometric detector. In various embodiments, the test for stability of step 330 simply determines whether the illumination field is sufficiently temporally constant so that the statistical dispersions measured at particular pixels correspond to noise in the photometric detector and shot noise of the radiation source rather than temporal changes in the illumination field. It is understood that some limited temporal changes in the illumination field may exist, and that the illumination field can vary with time so long as changes in the illumination field occur at a frequency substantially lower than the frequency of sampling used at step 320. In this situation, the set of samples measured in step 320 is analyzed to separate low frequency components produced by drift in the illumination field and higher frequency components produced by noise sources.

Next stable intensities and statistical dispersions are calculated for the detected range of intensities (step 350). In various embodiments, this is performed on a pixel-by-pixel basis by calculating the standard deviation of intensities measured at each pixel to measure the noise at the particular pixel. Then the signal value at the pixel is measured by averaging the value of intensities measured at the particular pixel. It is understood that any calculation to remove noise and to isolate the stable intensity value for the pixel can be employed without departing from the present teachings such as selecting the median intensity value or ignoring outliers and then averaging, or estimating a temporal drift in illumination level and correcting noise values to offset temporal drift. It is understood that any means of determining the stable intensity can be employed. Similarly, the statistical dispersions for like intensities is calculated as a measure of noise, for example by calculating the standard deviation of the measured intensities in the sample photometric intensity readings.

Figure 4:
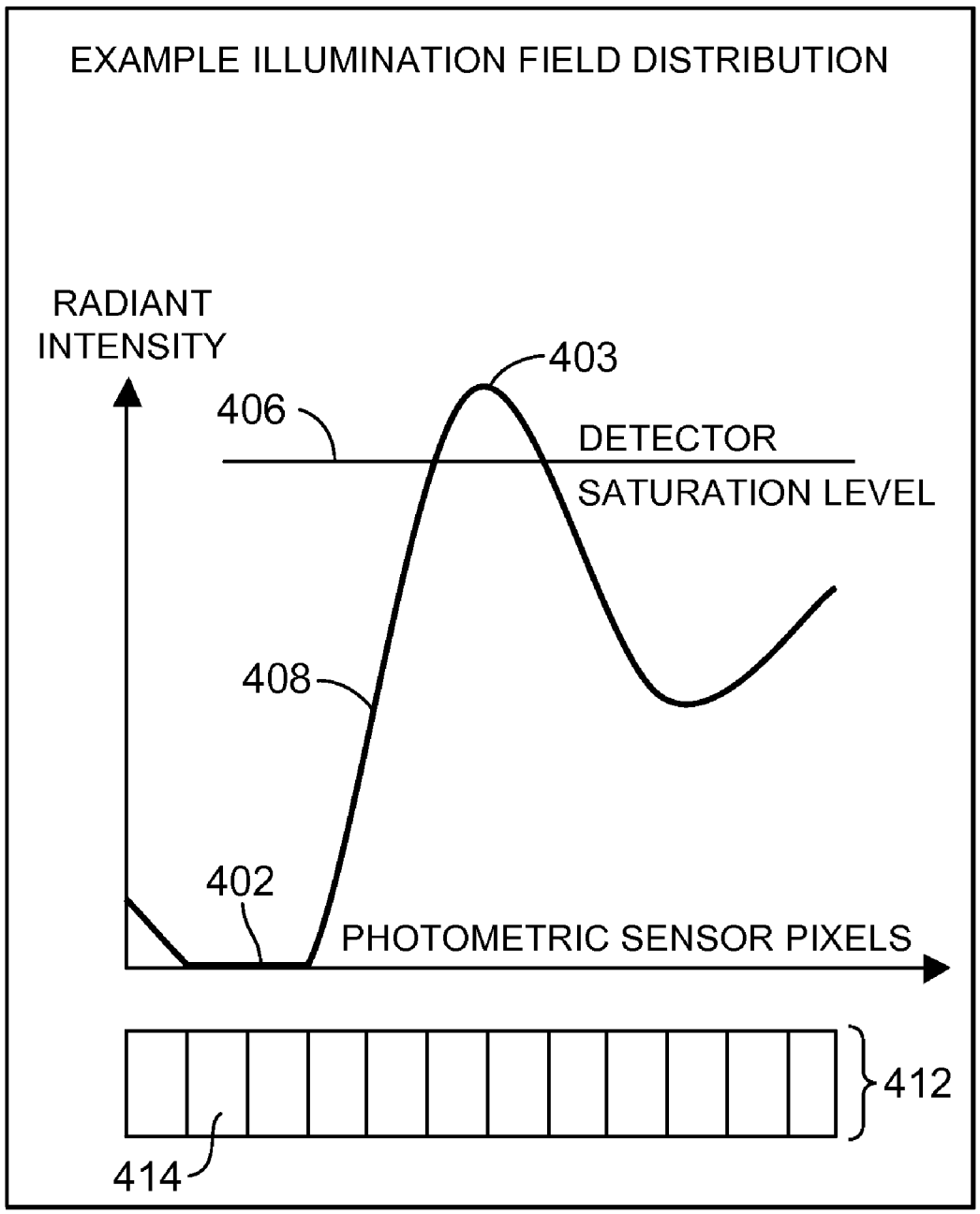
FIG. 4 illustrates an exemplary graph of radiant energy as a function of position along a one dimensional array of photometric sensor pixels.

FIG. 4 is a graph of radiant energy as a function of position along a one dimensional array of photometric sensor pixels. A linear array of pixels 414 is illustrated in FIG. 4 to show how a non-uniform illumination field can be provided to produce varying levels of intensity at the discrete pixels in a photometric detector. Generally, pixels in a photometric detector have a detector saturation level at which the pixel cannot store intensity values that are above the detector saturation level. Illumination field distribution curve 408 is shown ranging from dark (at segment 402) to saturated at segment 403.

Figure 5:
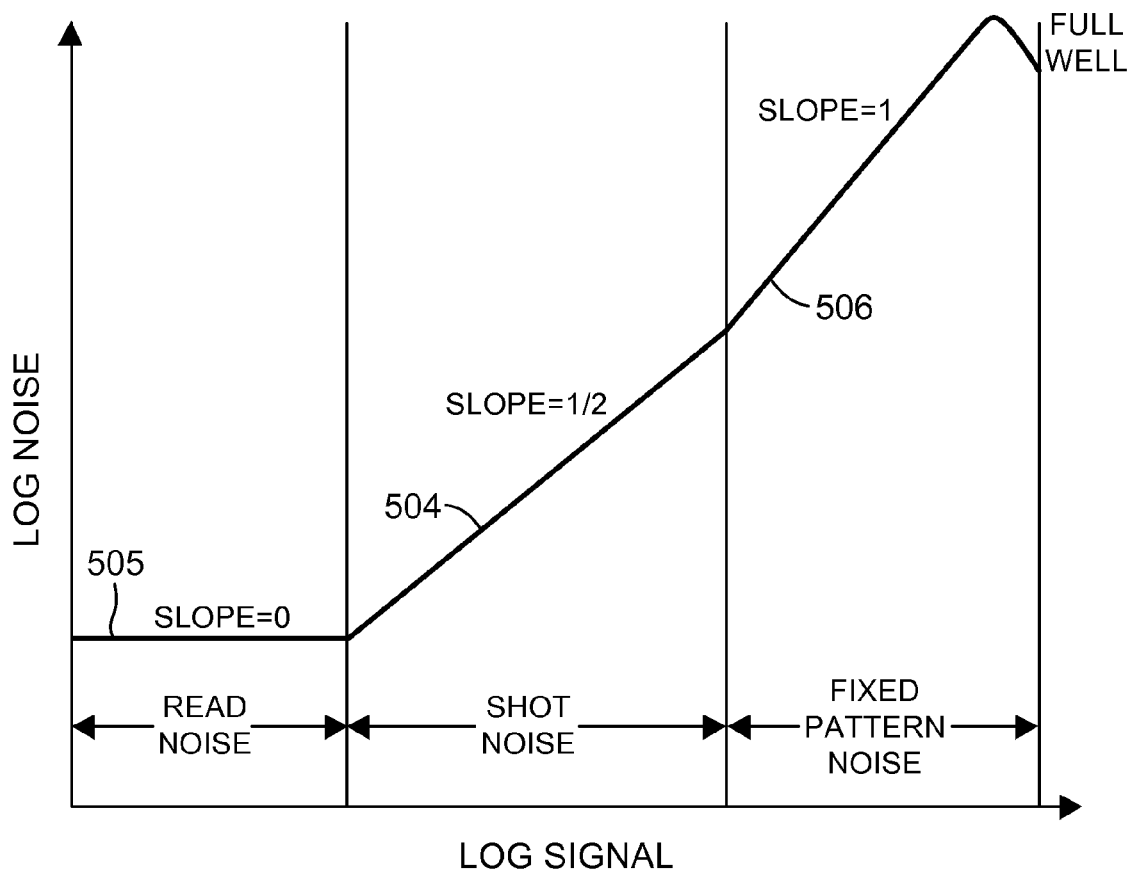
FIG. 5 illustrates an exemplary photon transfer curve.

FIG. 5 illustrates an exemplary photon transfer curve. The read noise segment 505 of the photon transfer curve is the portion of the photon transfer curve corresponding to noise levels where the photometric detector is dark or exposed to very low levels of intensity. Such noise is considered to be associated with the photometric detector itself and the circuitry used to read values from the photometric detector.

Segment 504 is called the shot-noise region that illustrates noise produced in the photometric detector caused by random arrival of electromagnetic energy on the photometric detector. Finally, segment 506 is the fixed pattern noise or pixel non-uniformity region that results from sensitivity differences between pixels.

Based on the signal to noise relationships established by measuring the photon transfer curve for a photometric detector, various characteristics of the photometric detector can be calculated. Such characteristics include photometric detector gain, dynamic range, full-well capacity or saturation intensity, and read noise. These characteristics can be evaluated to determine whether the photometric detector can provide measurements that allow the instrument that contains the photometric detector to operate within the instrument's stated limits of detection.

In various embodiments, the above exemplary photon transfer curve of a photometric detector is measured while the photometric detector is installed in an instrument. This allows observation of the effect of the instrument on the detector. In various embodiments, the photon transfer curve of a photometric detector is measured using highly non-uniform illumination fields eliminating the need for costly test fixtures designed to produce highly uniform illumination fields. The present teachings enable highly quantitative verification of an instrument's photometric detector without removing the detector from the instrument. In various embodiments, the photon transfer curve of a photometric detector can be measured with a lens assembly attached to the detector, for example to simplify manufacturing procedures. The photon transfer curve of a photometric detector can be measured with thousands of times higher resolution than methods employed by the prior art.

While the present teachings are described in conjunction with various embodiments, it is not intended that the present teachings be limited to such embodiments. On the contrary, the present teachings encompass various alternatives, modifications, and equivalents, as will be appreciated by those of skill in the art.

What is claimed is:

1. A method for validating the function of a biological instrument, the method comprising:
    providing an instrument comprising:
        a photometric sensor having a plurality of pixels; and
        a spatially non-uniform illumination source; wherein the spatial non-uniformity of the illumination source comprises a range of signal intensities spanning the dynamic range of the photometric sensor;
    capturing a series of images with the photometric sensor using the spatially non-uniform illumination source, wherein the images comprise a range of signal intensities spanning the dynamic range of the photometric sensor;
    computing a value of a signal intensity and a noise level for each pixel, wherein each of the signal intensities of the range of spatially non-uniform signal intensities is associated with at least one pixel receiving the intensity;
    estimating a relationship of signal intensity versus noise level for the photometric sensor over the dynamic range of the sensor using the computed values of signal intensity and noise level for each pixel; and
    determining if the photometric detector is within the operational limits of detection using the estimated relationship.

2. The method of claim 1, wherein the step of determining provides for instrument failure detection, instrument troubleshooting, and quantitative instrument subsystem characterization.

3. The method of claim 1, wherein the photometric sensor provided is selected from a charge coupled device (CCD), a complimentary metal oxide semiconductor device (CMOS) image sensor, a spectrometer, and a line-scan camera.

4. The method of claim 1, wherein the noise level for each pixel is calculated as a standard deviation of the signal intensities from the captured series of images for that pixel.

5. The method of claim 1, wherein the signal intensity for each pixel is calculated by averaging the intensities for the captured series of images for that pixel.

6. The method of claim 1, wherein the photometric sensor is validated on the basis of the computed signal intensities and noise levels for each pixel.

7. The method of claim 1, wherein the operational limits of detection for the photometric sensor are based on an operating characteristic of the photometric sensor.

8. The method of claim 7, wherein the operating characteristic is selected from gain, full well capacity, read noise, dynamic range, and shot-noise.

9. The method of claim 1, wherein the signal intensities from the spatially non-uniform illumination source are temporally constant.

10. The method of claim 1, wherein the spatially non-uniform illumination source comprises illumination that varies in spatial intensity over time to produce a time varying non-uniform illumination field.

11. The method of claim 1, wherein the spatially non-uniform illumination source provided is a test device.

12. The method of claim 1, wherein the spatially non-uniform illumination source provided is a sample for biological analysis.

* * * * *